United States Patent
Adler et al.

(10) Patent No.: US 6,433,372 B1
(45) Date of Patent: Aug. 13, 2002

(54) DENSE MULTI-GATED DEVICE DESIGN

(75) Inventors: Eric Adler, Jericho; Kerry Bernstein, Underhill; John J. Ellis-Monaghan, Grand Isle; Jenifer E. Lary, Hinesburg; Edward J. Nowak, Essex Junction; Norman J. Rohrer, Underhill, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/527,863

(22) Filed: Mar. 17, 2000

(51) Int. Cl.$^7$ ............................................... H01L 29/72
(52) U.S. Cl. ..................... 257/288; 257/506; 257/513; 257/752; 438/620; 438/624; 438/637
(58) Field of Search ................................. 257/288, 506, 257/513, 752, 306, 374, 397; 438/620, 624, 637, 639, 586

(56) References Cited

U.S. PATENT DOCUMENTS

| | | | |
|---|---|---|---|
| 3,921,195 A | * 11/1975 | Smith et al. | ................ 257/288 |
| 4,233,526 A | 11/1980 | Kurogi et al. | |
| 4,352,237 A | * 10/1982 | Widman | ..................... 257/288 |
| 4,892,835 A | 1/1990 | Rabinzohn et al. | |
| 5,151,759 A | 9/1992 | Vinal | |
| 5,243,212 A | 9/1993 | Williams | |
| 5,539,229 A | 7/1996 | Noble, Jr. et al. | |
| 5,559,352 A | 9/1996 | Hsue et al. | |
| 5,606,187 A | * 2/1997 | Bluzer et al. | ................ 257/288 |
| 5,663,586 A | 9/1997 | Lin | |
| 5,675,164 A | 10/1997 | Brunner et al. | |
| 5,675,166 A | 10/1997 | Ilderem et al. | |
| 5,705,417 A | 1/1998 | Tseng | |
| 5,786,615 A | 7/1998 | Saito | |
| 5,789,286 A | 8/1998 | Subbanna | |
| 5,792,703 A | * 8/1998 | Bronner et al. | ............. 257/288 |
| 5,824,584 A | 10/1998 | Chen et al. | |

* cited by examiner

*Primary Examiner*—Edward Wojciechowicz
(74) *Attorney, Agent, or Firm*—DeLio & Peterson, LLC; Kelly M. Reynolds; Richard A. Henkler

(57) ABSTRACT

A multigated FET having reduced diffusion capacitance, self-compensating effective channel length, improved short channel effects control, and enhanced density. Forming the FET by providing a plurality of separated insulated gates on a substrate, including forming insulating material on at least four surfaces of each of the gates, forming a dielectric layer on the substrate between the insulated gates, depositing and planarizing a layer of conductive material on and between the insulated gates down to the insulating material on the top surface of the insulated gates, and implanting diffusion regions into the substrate, adjacent to and beneath a portion of two distal ones of the plurality of insulated gates.

21 Claims, 4 Drawing Sheets

DENSE MULTI-GATED DEVICE DESIGN

BACKGROUND OF THE INVENTION

1. Field of the Invention

This invention relates to integrated circuit devices using Field Effect Transistors (FETs), and more particularly, to reduced parasitic capacitance of multigate MOSFET structures and methods of making the same.

2. Description of Related Art

Field effect transistor devices have become increasingly important in low voltage power application designs. However, semiconductor device parameters such as threshold voltage, sub-threshold leakage currents, and parasitic capacitances, typically source and drain parasitics, limit the performance of these FETs in the semiconductor device application.

Modern process technologies, such as shallow trench isolation and silicon-on-insulators (SOI), derive some performance advantage through the reduction of parasitic diffusion capacitance that would otherwise contribute to inefficient operation. However, these technologies have their own limitations. For example, there are many cost and material quality issues awaiting resolution before SOI can be a viable technology for commercial implementation. The channel mobility in SIMOX (oxygen-implanted silicon) or SOS (silicon-on-sapphire) SOI materials is not comparable to that of bulk or epitaxial silicon. Also, high defect density problems can arise from either the oxygen implantation or from a mismatch between lattice constants of silicon and the host crystal.

In U.S. Pat. No. 5,663,586 issued to Lin on Sep. 2, 1997, entitled, "FET DEVICE WITH DOUBLE SPACER," the sub-threshold leakage current of a FET device is minimized by providing a polysilicon spacer on the vertical sidewalls of the device. First spacer elements of polysilicon are provided on the vertical sidewalls along with second spacer elements of $SiO_2$ over the first spacers. In contrast, the instant invention does not add spacer gates to the side of the first gate. Rather, the second gate set is built with a damascene process that uses the first gate as a mandrel.

In U.S. Pat. No. 5,606,187 issued to Bluzer et al., on Feb. 25, 1997, entitled, "CHARGE COUPLED DEVICE GATE STRUCTURE HAVING NARROW EFFECTIVE GAPS BETWEEN GATE ELECTRODES," gaps between the transparent gates are filled with dielectric material having a predetermined (high) dielectric constant, thereby making the gap behave as if it were smaller than its actual physical size, and improving the device electrical behavior. Depending upon the dielectric, the junction parasitic capacitances may be effectively reduced. Importantly, the gaps between the gates are filled after gate definition.

Bearing in mind the problems and deficiencies of the prior art, it is therefore an object of the present invention to provide a multigate MOSFET device structure having reduced parasitic capacitance.

It is another object of the present invention to provide a method of making a multigate MOSFET device having reduced parasitic capacitance.

A further object of the invention is to provide a multigate FET structure with reduced parasitic diffusion capacitance for low power applications.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of forming a multi-gate FET comprising: providing a substrate; forming a plurality of separated, insulated gates on the substrate, each of the gates having electrically insulating material on at least top, bottom and two opposing side surfaces of the gates; forming a dielectric layer on the substrate between the insulated gates; depositing a layer of electrically conductive material between the insulated gates; planarizing the layer of conductive material down to the insulating material on the top surface of the insulated gates to expose the insulating material and form at least one region of the conductive material defined by and between the insulating material on the gates; and implanting diffusion regions into the substrate adjacent to, and beneath a portion of, two distal ones of the plurality of insulated gates for defining therebetween in the substrate a channel region of the multi-gate FET that is controlled by the two distal ones of the insulated gates and conductive region between them. The method further comprises, after planarizing, etching the conductive material to a level below the insulating material on the top surfaces of the insulated gates.

Additionally, the substrate is provided with shallow trench isolation structures, and the gates are formed and the diffusion regions are implanted between the shallow trench isolation structures. Contacts are also formed, electrically connected to the two distal ones of the insulated gates and conductive region between them.

The method further includes forming spacers adjacent the distal side surfaces of the two distal ones of the insulated gates. The substrate provided may be a silicon-on-insulator (SOI) substrate.

In a second aspect, the instant invention is directed to a method of forming a multi-gate FET comprising: providing a substrate; forming a plurality of separated, insulated gates on the substrate, each of the gates having electrically insulating material on at least top, bottom and two opposing side surfaces of the gates; forming a dielectric layer on the substrate between the insulated gates; depositing a layer of electrically conductive material on and between the insulated gates; planarizing the layer of conductive material down to the insulating material on the top surface of the insulated gates to expose the insulating material and form at least one region of the conductive material defined by and between the insulating material on the gates; etching the conductive material to a level below the insulating material on the top surfaces of the insulated gates; implanting diffusion regions into the substrate adjacent to, and beneath a portion of, two distal ones of the plurality of insulated gates for defining therebetween in the substrate a channel region of the multi-gate FET that is controlled by the two distal ones of the insulated gates and conductive region between them; forming spacers adjacent the distal side surfaces of the two distal ones of the insulated gates; and, forming contacts electrically connected to the two distal ones of the insulated gates and conductive region between them.

In a third aspect, the instant invention is directed to a multi-gate FET comprising: a substrate; a plurality of separated, insulated gates on the substrate, each of the gates having electrically insulating material on at least top, bottom and two opposing side surfaces of the gates; a dielectric layer on the substrate between the insulated gates; a layer of electrically conductive material between the insulated gates forming at least one region of the conductive material defined by the insulating material on the gates; and, a layer of electrically conductive material between the insulated gates forming at least one region of the conductive material defined by and between the insulating material on the gates;

and, diffusion regions in the substrate adjacent to, and beneath a portion of, two distal ones of the plurality of insulated gates defining therebetween in the substrate a channel region of the multi-gate FET controlled by the two distal ones of the insulated gates and conductive region between them.

In a fourth aspect, the instant invention is directed to a multi-gate FET comprising: providing a substrate; a plurality of separated, insulated gates on the substrate, each of the gates having electrically insulating material on at least top, bottom and two opposing side surfaces of the gates; a dielectric layer on the substrate between the insulated gates; a layer of electrically conductive material between the insulated gates forming at least one region of the conductive material defined by and between the insulating material on the gates; diffusion regions in the substrate adjacent to, and beneath a portion of, two distal ones of the plurality of insulated gates for defining therebetween in the substrate a channel region of the multi-gate FET that is controlled by the two distal ones of the insulated gates and conductive region between them; spacers adjacent the distal side surfaces of the two distal ones of the insulated gates; and, contacts electrically connected to the two distal ones of the insulated gates and conductive region between them.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
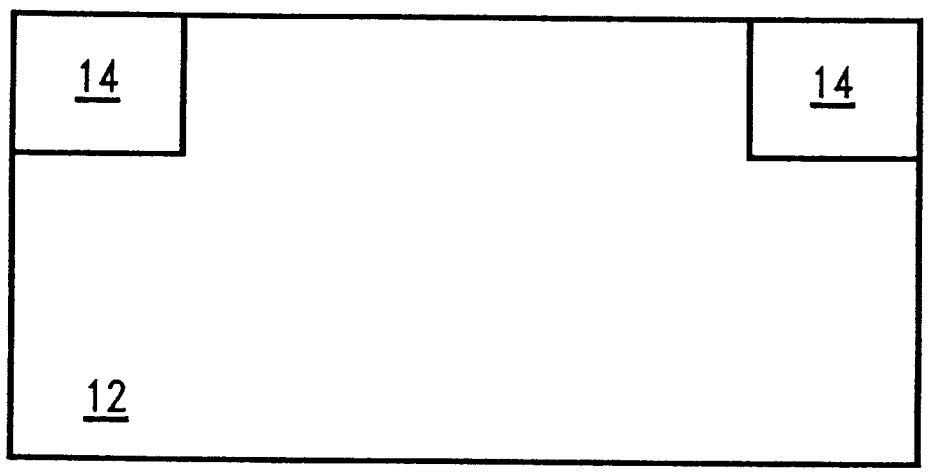
FIG. 1 is a cross-sectional view of a substrate having shallow trench isolation structures therein.

In describing the preferred embodiment of the present invention, reference will be made herein to FIGS. 1–8 of the drawings in which like numerals refer to like features of the invention. Features of the invention are not necessarily shown to scale in the drawings.

The multigated FET disclosed herein has the advantages of greatly reduced diffusion capacitance, self-compensating effective channel length ($L_{eff}$), and improved short channel effects (SCE) control, and density.

Figure 2:
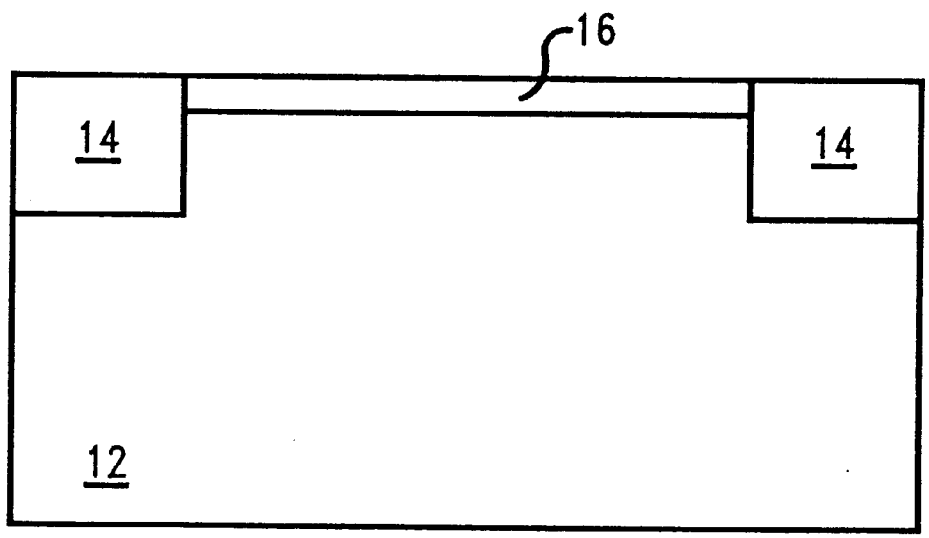
FIG. 2 is a cross-sectional view of the substrate of FIG. 1 with an oxide layer formed on the top surface.

Referring now to FIGS. 1–8, and more particularly to FIG. 1, there is depicted a first embodiment of the invention. Substrate 12 is a semiconductor wafer, comprised, for example, of silicon, with a background doping which could either be p-type or n-type. Optionally, if a silicon-on-insulator structure is desired, substrate 12 includes a lower layer of a suitable oxide material, such as silicon dioxide. Spaced apart shallow trench isolation (STI) structures 14 are formed by conventional processing. Between the STI structures a thin gate dielectric layer 16 is deposited on the surface of the substrate 12, preferably of oxidized silicon, such as an $SiO_2$ layer with a thickness between about 70 to 150 Angstroms, as shown in FIG. 2. This is not meant to be considered in a limiting sense, since it is well known in the art to incorporate other types of semiconducting material that may also be effectively utilized in this invention.

Figure 3:
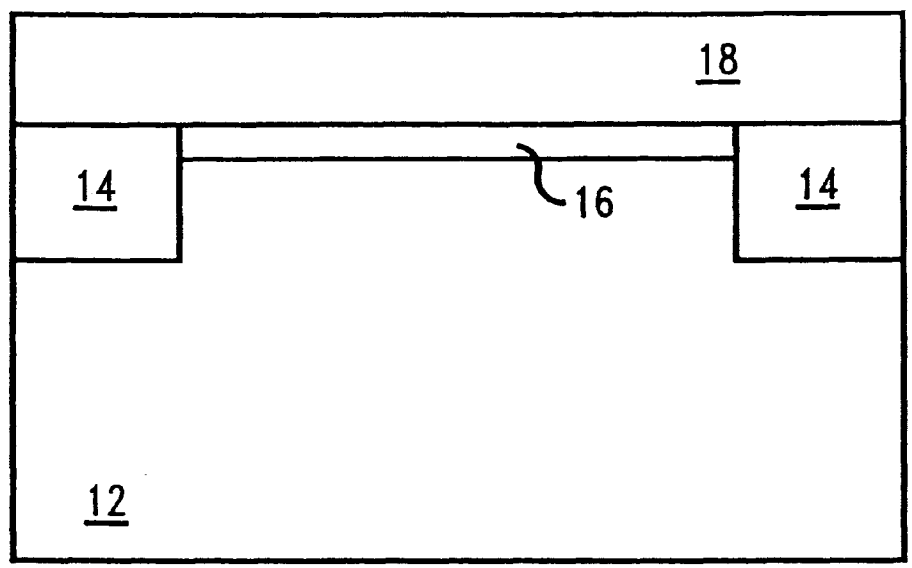
FIG. 3 is a cross-sectional view of the substrate of FIG. 2 with a first polysilicon layer applied thereon.
Figure 4:
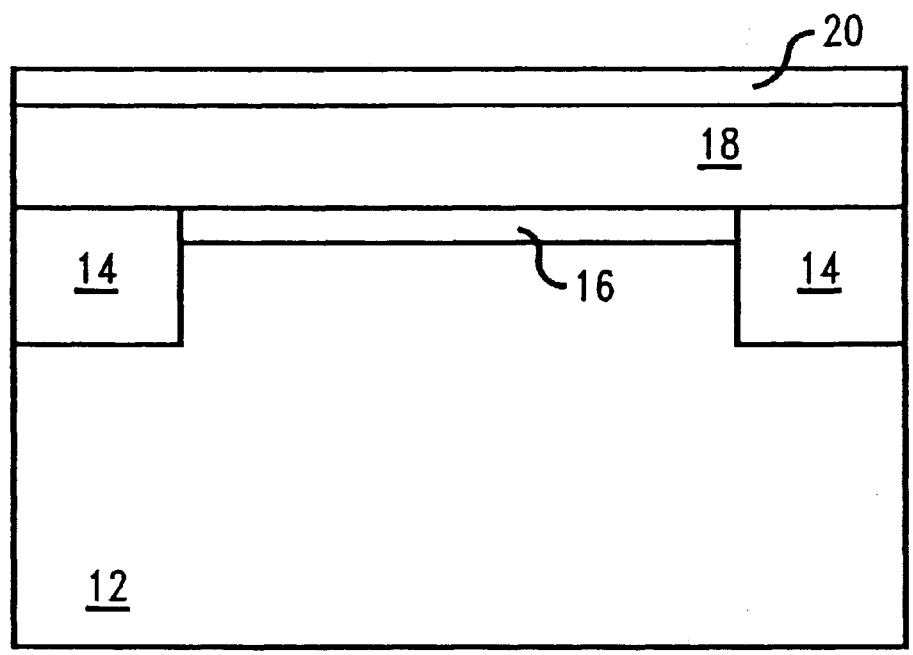
FIG. 4 is a cross-sectional view of the substrate of FIG. 3 having a silicon nitride layer applied to the top surface.
Figure 5:
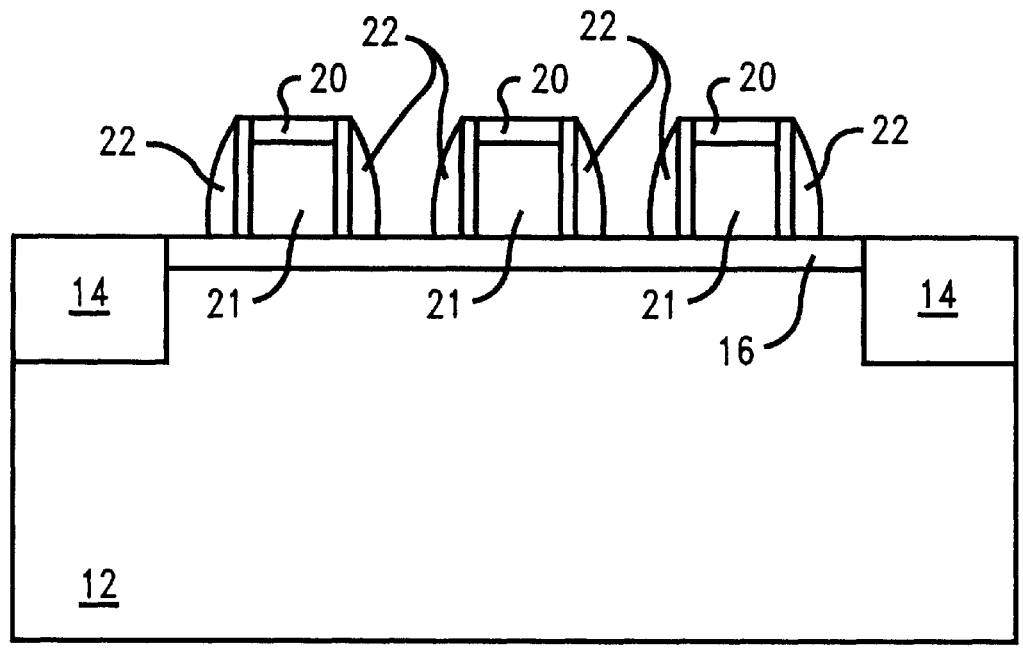
FIG. 5 is a cross-sectional view of the substrate of FIG. 4 having gates and spacers formed through patterning, developing, and etching of the nitride layer and first polysilicon layer.

Referring to FIG. 3, over gate oxide layer 16 and shallow trench isolation structure 14 is then deposited a first layer of polysilicon 18. This is then followed by a insulating layer of silicon nitride 20, as shown in FIG. 4. Referring to FIG. 5, the polysilicon layer 18 and silicon nitride insulator layer 20 are then patterned, developed, and etched through to the gate oxide layer 16 to form a plurality of separated insulated gates 21 on the gate oxide layer 16. Preferably at least two, three, four, or more of such insulated gate structures 21 may be provided on the gate oxide layer between the spaced apart STI structures 14. In each of these gates 21, there are electrically insulating layers on the top surface (silicon nitride layer 20), two opposing side surfaces of silicon dioxide or silicon nitride (spacers 22), and a bottom oxide surface (gate oxide 16). The gate oxide layer formed on the substrate also extends between each of the gate structures 21, and between the distal gate structures and the STI structures 14.

Figure 6:
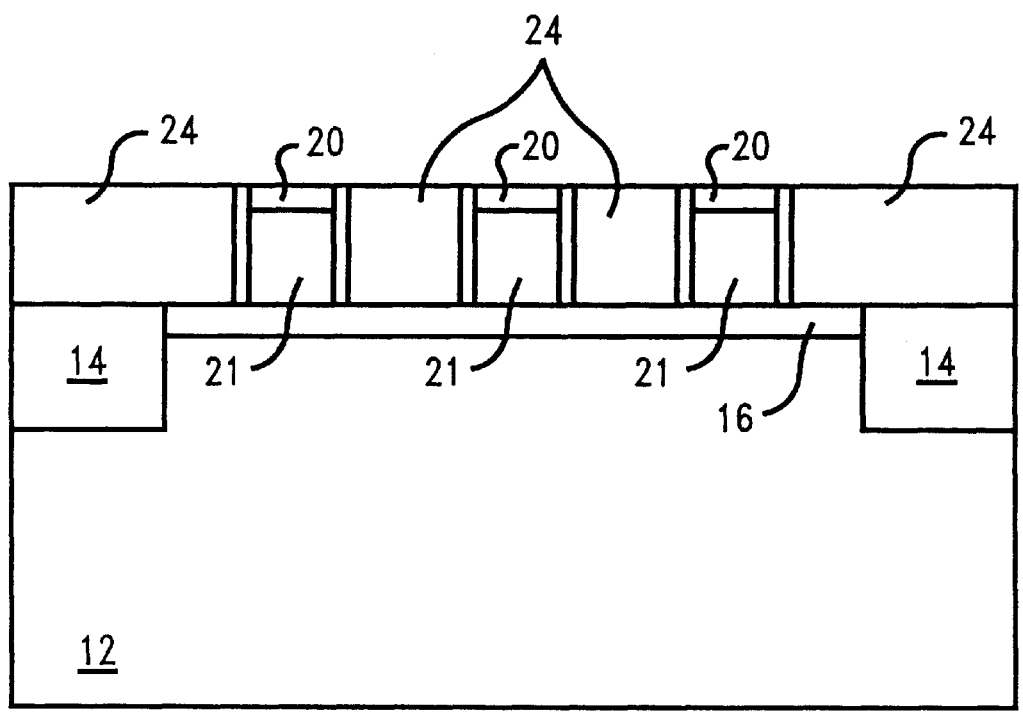
FIG. 6 is a cross-sectional view of the substrate of FIG. 5 having a second polysilicon layer applied thereon.
Figure 7:
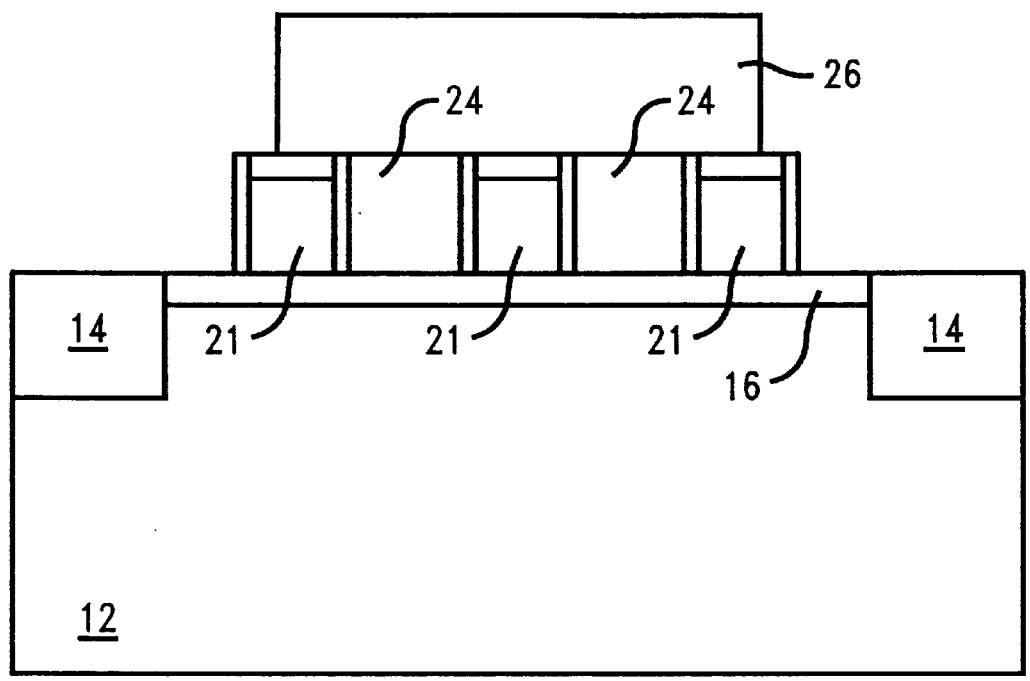
FIG. 7 is a cross-sectional view of the substrate of FIG. 6 being patterned by an applied resist.

Following formation of the gates structures, there is deposited a second polysilicon silicon layer 24, as shown in FIG. 6, between and optionally over the insulated gate structures 21. This second polysilicon silicon layer 24 is then planarized by chemical, mechanical polishing and/or reactive ion etching to expose the insulating layers 20 on the tops of the gate structures 21. This then forms a layer of electrically conductive material between each of the insulated gates. The portion of layer 24 outside of the distal ones of the insulating gates 21 is then removed by depositing, patterning, and developing a resist layer 26 over the gate structures 21 and portions of polysilicon layer 24 between the gate structures. FIG. 7 depicts this resist 26. The portions of the second polysilicon layer 24 outside of the resist layer and the gate structures is then etched down to the gate oxide layer 16 and STI structures 14.

Subsequently, the resist layer is removed and there is formed at least one and preferably a plurality of regions of conductive material 24 which are defined by and between the insulating materials around each of the gate structures 21.

Figure 8:
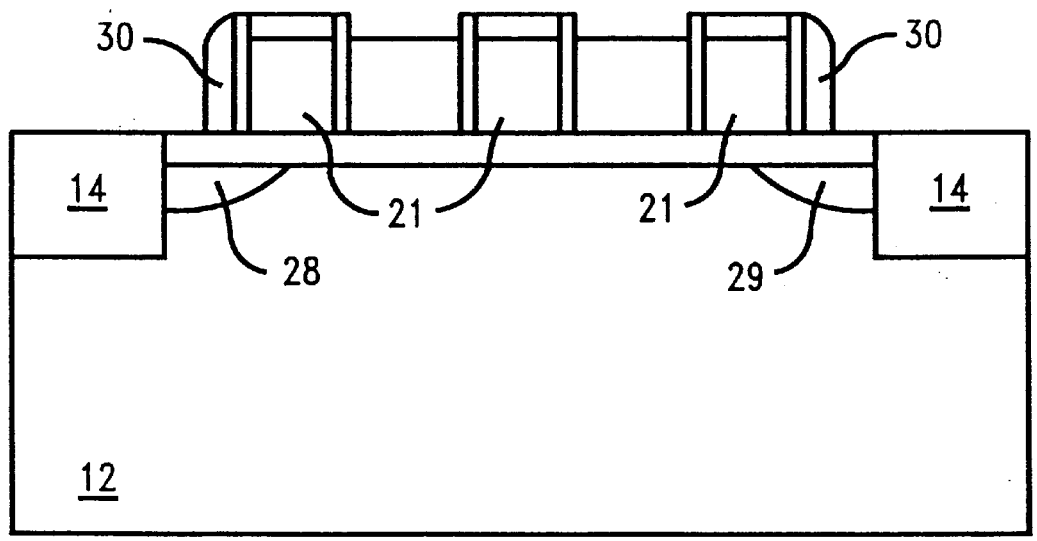
FIG. 8 is a cross-sectional view of the substrate of FIG. 7 having source and drain regions implanted therein.

Thereafter, source and drain regions 28 and 29, shown in FIG. 8, are implanted by diffusion, adjacent to and beneath the gate structures 21, and adjacent to the STI structures 14. Spacers, 30 are also formed.

Finally, contacts are formed by conventional processing to form electrical connectivity with gate structures 21 and with the electrically conductive layer 24 between each of the gate structures.

Thus, the present invention achieves the objects recited above. The multi-gated FET has the advantages of greatly reduced diffusion capacitance, self-compensating effective channel length ($L_{eff}$), improved short channel effects (SCE) control, and enhanced density. The reduced capacitance may be offset by the increased gate-to-gate capacitance, but this can be minimized by using a low dielectric constant material for a spacer, such as fluorinated oxide.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming a multi-gate FET comprising:
   providing a substrate having spaced apart shallow trench isolation structures;
   forming a dielectric layer on the substrate between the spaced apart shallow trench isolation structures;
   forming a plurality of separated, non-overlapping insulated gates on the dielectric layer between the spaced apart shallow trench isolation structures, each of the gates having electrically insulating material on at least top, bottom and two opposing side surfaces of the gates;
   depositing a layer of electrically conductive material between the insulated gates;
   planarizing the layer of conductive material down to the insulating material on the top surface of the insulated gates to expose the insulating material and form at least one region of the conductive material defined by and between the insulating material on the gates; and
   implanting diffusion regions into the substrate adjacent to, and beneath a portion of, two distal ones of the plurality of insulated gates for defining therebetween in the substrate a channel region of the multi-gate FET that is controlled by the two distal ones of the insulated gates and conductive region between them.

2. The method of claim 1 further comprising, after planarizing, etching the conductive material to a level below the insulating material on the top surfaces of the insulated gates.

3. The method of claim 1 wherein the diffusion regions are implanted between the shallow trench isolation structures.

4. The method of claim 1 further including forming contacts electrically connected to the two distal ones of the insulated gates and conductive region between them.

5. The method of claim 1 further including forming spacers adjacent the distal side surfaces of the two distal ones of the insulated gates.

6. The method of claim 1 wherein the substrate provided is a silicon-on-insulator (SOI) substrate.

7. A method of forming a multi-gate FET comprising:
   providing a substrate having spaced apart shallow trench isolation structures;
   forming a dielectric layer on the substrate between the spaced apart shallow trench isolation structures;
   forming a plurality of separated, non-overlapping insulated gates on the dielectric layer between the spaced apart shallow trench isolation structures, each of the gates having electrically insulating material on at least top, bottom and two opposing side surfaces of the gates;
   depositing a layer of electrically conductive material on and between the insulated gates;
   planarizing the layer of conductive material down to the insulating material on the top surface of the insulated gates to expose the insulating material and form at least one region of the conductive material defined by and between the insulating material on the gates;
   etching the conductive material to a level below the insulating material on the top surfaces of the insulated gates;
   implanting diffusion regions into the substrate adjacent to, and beneath a portion of, two distal ones of the plurality of insulated gates for defining therebetween in the substrate a channel region of the multi-gate FET that is controlled by the two distal ones of the insulated gates and conductive region between them;
   forming spacers adjacent the distal side surfaces of the two distal ones of the insulated gates; and
   forming contacts electrically connected to the two distal ones of the insulated gates and conductive region between them.

8. The method of claim 7 wherein the diffusion regions are implanted between the shallow trench isolation structures.

9. The method of claim 8 wherein the spacers are formed between two distal ones of the insulated gates and the shallow trench isolation structures.

10. The method of claim 7 wherein the substrate provided is a silicon-on-insulator (SOI) substrate.

11. The method of claim 7 wherein the spacers are formed from a fluorinated oxide material.

12. A multi-gate FET comprising:
   a substrate having spaced apart shallow trench isolation structures;
   a dielectric layer on the substrate therebetween the spaced apart shallow trench isolation structures;
   a plurality of separated, non-overlapping insulated gates on the dielectric layer between the spaced apart shallow trench isolation structures, each of the gates having electrically insulating material on at least top, bottom and two opposing side surfaces of the gates;
   a layer of electrically conductive material between the insulated gates forming at least one region of the conductive material defined by the insulating material on the gates; and
   diffusion regions in the substrate adjacent to, and beneath a portion of, two distal ones of the plurality of insulated gates defining therebetween in the substrate a channel region of the multi-gate FET controlled by the two distal ones of the insulated gates and conductive region between them.

13. The FET of claim 12 wherein the diffusion regions are disposed between the shallow trench isolation structures.

14. The FET of claim 12 further including contacts electrically connected to the two distal ones of the insulated gates and conductive region between them.

15. The FET of claim 12 further including spacers adjacent the distal side surfaces of the two distal ones of the insulated gates.

16. The FET of claim 12 wherein the substrate is a silicon-on-insulator (SOI) substrate.

17. A multi-gate FET comprising:
   a substrate having spaced apart shallow trench isolation structures;
   a dielectric layer on the substrate therebetween the spaced apart shallow trench isolation structures;
   a plurality of separated, non-overlapping insulated gates on the dielectric layer between the spaced apart shallow trench isolation structures, each of the gates having electrically insulating material on at least top, bottom and two opposing side surfaces of the gates;

a layer of electrically conductive material between the insulated gates forming at least one region of the conductive material defined by and between the insulating material on the gates;

diffusion regions in the substrate adjacent to, and beneath a portion of, two distal ones of the plurality of insulated gates for defining therebetween in the substrate a channel region of the multi-gate FET that is controlled by the two distal ones of the insulated gates and conductive region between them;

spacers adjacent the distal side surfaces of the two distal ones of the insulated gates; and contacts electrically connected to the two distal ones of the insulated gates and conductive region between them.

18. The FET of claim 17 wherein the diffusion regions are disposed between the shallow trench isolation structures.

19. The FET of claim 18 wherein the spacers are disposed between two distal ones of the insulated gates and the shallow trench isolation structures.

20. The FET of claim 17 wherein the substrate is a silicon-on-insulator (SOI) substrate.

21. The FET of claim 17 wherein the spacers comprise a fluorinated oxide material.

* * * * *